US007804178B2

(12) United States Patent
Syri et al.

(10) Patent No.: US 7,804,178 B2
(45) Date of Patent: Sep. 28, 2010

(54) SEMICONDUCTOR COMPONENT WITH SURFACE MOUNTABLE DEVICES AND METHOD FOR PRODUCING THE SAME

(75) Inventors: Erich Syri, Wenzenbach (DE); Gerold Gruendler, Regensburg (DE); Juergen Hoegerl, Regensburg (DE); Thomas Killer, Hohenschambach (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 11/748,135

(22) Filed: May 14, 2007

(65) Prior Publication Data

US 2007/0262433 A1    Nov. 15, 2007

(30) Foreign Application Priority Data

May 12, 2006  (DE)  ........................ 10 2006 022 748

(51) Int. Cl.
*H01L 23/02* (2006.01)
*H01L 29/40* (2006.01)

(52) U.S. Cl. .................. 257/778; 257/516; 257/686; 257/777

(58) Field of Classification Search ............. 257/678, 257/777, 778, 686; 438/106, 26
See application file for complete search history.

(56) References Cited

U.S. PATENT DOCUMENTS

| | | | | |
|---|---|---|---|---|
| 6,108,210 A | * | 8/2000 | Chung | 361/747 |
| 6,291,267 B1 | * | 9/2001 | Dore et al. | 438/108 |
| 6,313,521 B1 | * | 11/2001 | Baba | 257/678 |
| 6,392,289 B1 | * | 5/2002 | Tandy | 257/678 |
| 6,546,620 B1 | * | 4/2003 | Juskey et al. | 29/840 |
| 6,632,704 B2 | * | 10/2003 | Kumamoto et al. | 438/106 |
| 6,867,486 B2 | * | 3/2005 | Hong | 257/686 |
| 6,946,601 B1 | * | 9/2005 | Lee et al. | 174/534 |
| 7,087,455 B2 | * | 8/2006 | Fukuda et al. | 438/106 |
| 7,109,524 B2 | * | 9/2006 | Killer | 257/82 |
| 7,109,592 B2 | * | 9/2006 | Fortin et al. | 257/793 |
| 7,279,771 B2 | * | 10/2007 | Sunohara et al. | 257/516 |
| 2002/0074669 A1 | * | 6/2002 | Watanabe et al. | 257/777 |
| 2002/0108768 A1 | * | 8/2002 | Jimarez et al. | 174/52.4 |
| 2002/0140085 A1 | * | 10/2002 | Lee et al. | 257/724 |
| 2002/0173074 A1 | * | 11/2002 | Chun-Jen et al. | 438/108 |
| 2004/0036162 A1 | * | 2/2004 | Chuang et al. | 257/717 |
| 2004/0113284 A1 | * | 6/2004 | Zhao et al. | 257/782 |
| 2004/0262782 A1 | * | 12/2004 | Ellis et al. | 257/787 |
| 2006/0103030 A1 | * | 5/2006 | Aoki et al. | 257/778 |
| 2007/0087471 A1 | * | 4/2007 | Yang et al. | 438/106 |
| 2008/0237890 A1 | * | 10/2008 | Tago | 257/778 |

* cited by examiner

*Primary Examiner*—Matthew C Landau
*Assistant Examiner*—James M Mitchell
(74) *Attorney, Agent, or Firm*—Edell, Shapiro & Finnan, LLC

(57) ABSTRACT

A semiconductor component including: a substrate, at least one semiconductor chip arranged on the substrate and at least one passive device likewise arranged on the substrate. The passive device is mounted with its underside on the substrate. The semiconductor component further includes an interspace disposed between the underside of the passive device and the substrate. The interspace is filled with an underfilling material. In order to avoid the solder pumping effect, the upper side and the lateral sides of the passive device are also embedded in a plastic compound.

12 Claims, 1 Drawing Sheet

SEMICONDUCTOR COMPONENT WITH SURFACE MOUNTABLE DEVICES AND METHOD FOR PRODUCING THE SAME

CROSS REFERENCE TO RELATED APPLICATIONS

This application claims priority under 35 U.S.C. §119 to German Application No. DE 102006022748.4 filed on May 12, 2006, entitled "Semiconductor Component Having Surface Mountable Devices and Method for its Production," the entire contents of which are hereby incorporated by reference.

BACKGROUND

Semiconductor components typically contain a large number of devices in addition to semiconductor chips. These devices include passive devices (e.g., resistors, coils, capacitors and diodes).

For example, U.S. Pat. No. 6,313,521 (Baba) discloses a component in which a semiconductor chip and passive components are arranged on a substrate. The semiconductor chip is designed as a flip chip and provided with an underfilling material. An adhesion promoter which conducts heat and electric current is applied to the exposed upper side of the semiconductor chip and joins the semiconductor chip to a heat sink. If, in the case of this arrangement, an excessive quantity of adhesion promoter is applied to the upper side of the semiconductor chip during mounting, there is the risk that the conductive adhesion promoter will produce a contact with the passive components and short-circuit the latter. In order to avoid this, it is proposed to embed the passive components with their lateral sides and their rear sides in the underfilling compound of the flip chip.

In order to increase the reliability of the soldered joint between passive device and substrate, it is also known to provide the passive devices themselves, if they are surface mountable, with an underfilling material, which is introduced into an interspace between the substrate and the underside of the device, in a manner similar to flip chips. This results in a reduction in the risk of damage to the soldered contacts in the event of alternating thermal loading because of different thermal expansion coefficients of device and substrate, which can lead to cracks or similar damage to the soldered joint. Typically, the underfilling material used is a material which, by way of capillary action, can be introduced into the interspace without pressure and forms a meniscus at the lateral sides of the device.

However, in the case of such devices embedded with the underside and the lateral sides in the underfilling material, it is possible for problems with what is known as the "solder pumping" effect to occur during subsequent soldering processes during the board mounting by the user. In this case, the underfilling material expands during the reflow and forces the liquid solder out of its cavity. In this way, the liquid solder can, for example, be "pumped" to the upper side of the device.

SUMMARY

A semiconductor component according to the present invention embodiments and including a substrate and at least one semiconductor chip arranged on the substrate includes at least one passive, preferably surface mountable, device, likewise arranged on the substrate, having an upper side, an underside and lateral sides. The passive device is mounted with an underside on the substrate and provided with an underfilling material, typically a plastic compound. The passive device is also embedded with its upper side and its lateral sides in this underfilling material.

The semiconductor component is based on the concept that the introduction of underfilling material should be maintained for a reliable soldered joint. In order at the same time to prevent the "solder pumping" effect, the lateral sides and the upper side of the device should likewise be embedded in underfilling material, so that pumping of liquid solder over the lateral sides to the upper side is not possible. Thus, the passive device should be completely surrounded by an underfilling material.

The semiconductor chip provided is optionally a flip chip, whose active side is embedded in an underfilling material. However, other semiconductor chips are also conceivable, such as wire bonded semiconductor chips or "board on chip" structures, in which the bonding wires are embedded in a plastic compound. The passive devices employed can be, for example, resistors, coils, capacitors and/or diodes.

The underfilling material used for embedding the passive device is advantageously the same plastic which is used to embed regions of the semiconductor chip. In this case, the underfilling material may comprise thermoplastics selected from the group including: polyethylene, polypropylene, polyamide and polyester and curable plastic resins (e.g., epoxy resins, etc.) which can be introduced into the interspace without pressure by capillary action. In order to permit complete potting of the passive devices, the passive device is surrounded by a frame-like potting mold, which substantially comprises lateral sides and is placed on the substrate.

According to present invention embodiments, a method for the production of a semiconductor component comprises the following steps: providing a substrate, to which at least one semiconductor chip and at least one passive device are fitted or arranged with its underside facing the substrate. In this case, an interspace is formed between the underside of the passive device and the substrate.

In a next step, the passive device is surrounded by a potting mold, if appropriate, and regions of the semiconductor chip are embedded in a plastic compound as underfilling material.

The passive device is potted with an underfilling material embedding its lateral sides and its upper side and filling the interspace between the underside of the passive device and substrate. The underfilling material is preferably the same material being used for the semiconductor chip. Then, the plastic serving as underfilling material is cured.

In order to ensure that even the upper side of the passive device is embedded in the plastic, and thus the "solder pumping" effect is avoided as completely as possible, $h_v \geq h_b$ applies to the height, $h_v$, of the potting mold and the height, $h_b$, of the device. This ensures that the potting mold is sufficiently high to ensure coverage of the upper side with plastic.

The component according to present invention embodiments has the advantage that, for the advantage of a reliable soldered joint, which is ensured by the underfilling material in the interspace between passive device and substrate, the disadvantage of the "solder pumping" effect is avoided. As a result of the complete potting of the passive devices, the underfilling material is prevented in a particularly simple way from forcing liquid solder out of its cavity as a result of its expansion during board mounting by a user. If the same material is used as underfilling material for the semiconductor chip, for the device and for potting the device, the potting step can efficiently be integrated into the production process of the component.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Exemplary embodiments of the semiconductor component will be explained in more detail in the following with reference to the appended figures, where.

DETAILED DESCRIPTION

Figure 1:
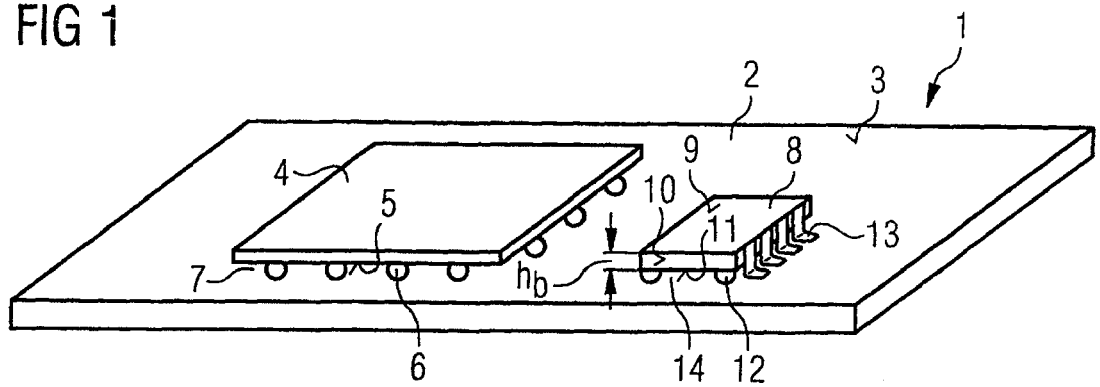
FIG. 1 shows a semiconductor component including a substrate, to which a semiconductor chip and a passive device are fitted.

The semiconductor component 1 according to FIG. 1 includes a substrate 2, for example, a rewiring substrate. Arranged on the upper side 3 of the substrate 2 are at least one semiconductor chip 4 and at least one passive device 8. However, the substrate 2 can also be populated with electronic components both on its upper side 3 and on its underside.

The semiconductor chip 4 in FIG. 1 is designed using flip chip technology, but the use of other semiconductor chips is also conceivable. For the purpose of mounting on the substrate 2, the semiconductor chip 4 includes on its active side 5 a number of flip chip contacts 6 (e.g., solder balls), which are soldered onto contact areas (not shown), on the substrate 2 and thus join the semiconductor chip 4 to the substrate 2 both electrically and mechanically. An interspace 7 is formed between the active side 5 of the semiconductor chip 4 and the upper side 3 of the substrate 2.

The passive device 8 (e.g., a resistor, a capacitor, coil or diode) has an underside 11 facing the substrate 2, an upper side 9 and lateral sides 10. The passive device 8 is fixed on the upper side 3 of the substrate 2 via soldered joints 12 and/or adhesive bonds (not shown). The passive device can also include a series of contacts 13 connecting the passive device electrically to the substrate 2. An interspace 14 is also formed between the underside 11 of the passive device 8 and the upper side 3 of the substrate 2. The passive device 8 has a height, $h_b$.

FIG. 1 shows the semiconductor component following the fitting of the semiconductor chip 4 and of the passive device 8 to the substrate 2. The soldering process or reflow has been completed but no underfilling material has yet been applied. Via the underfilling material, the intention is for the interspaces (7, 14) to be filled, the underfilling material serving as a powerful adhesive layer between the substrate 2 and the semiconductor chip 4 and between the substrate 2 and the passive device 8, and protects the soldered points in the event of alternating thermal loading. However, in order to prevent what is known as the solder pumping effect, which can occur during the soldering process in the case of a passive device 8 provided with underfilling material, the passive device 8 is potted completely and not just underfilled to some extent.

Figure 2:
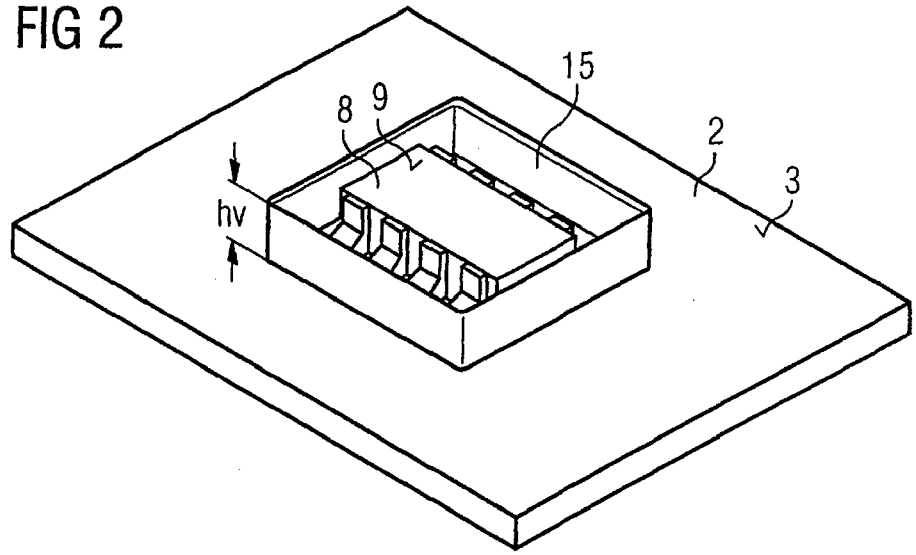
FIG. 2 shows the passive device after being surrounded with a potting mold.

To this end, as illustrated in FIG. 2, the passive device 8 is surrounded with a potting mold 15, which is placed on the upper side 3 of the substrate 2. The potting mold 15 has a height, $h_v$, where $h_v$ should be at least as great as $h_b$. The purpose of the potting mold is to permit the complete embedding of the passive device 8 with its underside 11, its upper side 9 and its lateral sides 10. Therefore, the potting mold 15 should be at least as high as the passive device 8.

After the passive device 8 has been surrounded with the potting mold 15, the passive device 8 can be potted. For this purpose, it is possible to use the same plastic material utilized for the underfilling of the semiconductor chip 4, or else a different plastic material, so that the application of the underfilling material and the potting can be carried out in a single process step.

Figure 3:
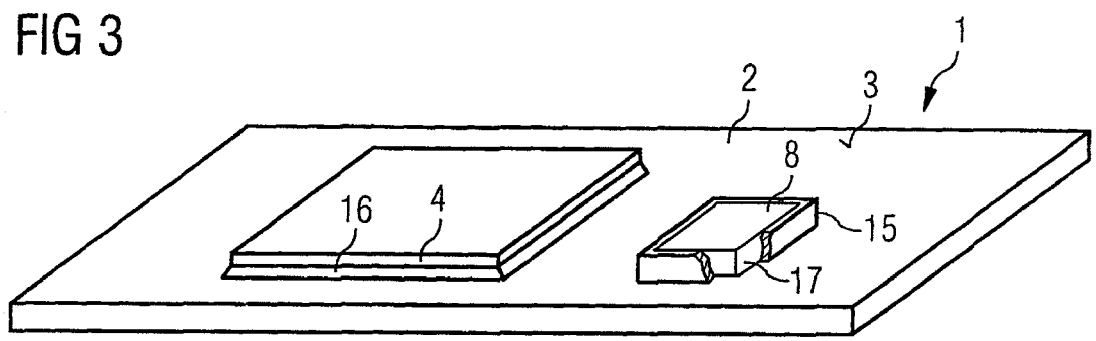
FIG. 3 shows the semiconductor component after the potting of the passive device and after the introduction of underfilling material between the semiconductor chip and the substrate.

FIG. 3 shows the semiconductor component 1 after this process step. The interspace 7 between the semiconductor chip 4 and the surface 3 of the substrate 2 has been filled with an underfilling material 16 and the passive device has been potted with a plastic compound 17. Therefore, in the event that the component is soldered to a system board, solder pumping effects are avoided.

While the semiconductor component and method have been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor component including:
   a substrate;
   at least one semiconductor chip arranged directly on the substrate and including an upper side, an underside, and lateral sides;
   a first underfilling material disposed within an interspace between the underside of the semiconductor chip and the substrate without embedding the upper side and lateral sides of the semiconductor chip;
   at least one passive device arranged directly on the substrate and including an upper side, an underside, and lateral sides, wherein the passive device is arranged adjacent to and spaced apart from the semiconductor chip such that no portion of the passive device lies between the semiconductor chip and the substrate; and
   a second underfilling material disposed within an interspace between the underside of the passive device and the substrate and embedding the upper side and the lateral sides of the passive device, wherein the second underfilling material embeds only the passive device and not the semiconductor chip.

2. The semiconductor component according to claim 1, wherein the passive device is surface mountable.

3. The semiconductor component according to claim 1, wherein the semiconductor chip comprises a flip chip such that the underside of the semiconductor chip is an active side, the active side being covered with the first underfilling material.

4. The semiconductor component according to claim 1, wherein the first and second underfilling materials are the same.

5. The semiconductor component according to claim 1, further comprising:
   a potting mold surrounding the passive device embedded in the second underfilling material, wherein the potting mold surrounds only the passive device.

6. The semiconductor component according to claim 5, wherein the potting mold has a height $h_v$, and wherein the height $h_v$ is greater than or equal to a height $h_b$ of the passive device.

7. The semiconductor component according to claim 1, wherein the passive device comprises a resistor.

8. The semiconductor component according to claim 1, wherein the passive device comprises a capacitor.

9. The semiconductor component according to claim 1, wherein the passive device comprises a coil.

10. The semiconductor component according to claim 1, wherein each of the first and second underfilling materials comprises a thermoplastic selected from the group including: polyethylene, polypropylene, polyamide and polyester.

11. The semiconductor component according to claim 1, wherein the second underfilling material comprises a curable plastic resin that is introduced into the interspace between the passive device and the substrate without pressure via capillary action.

12. The semiconductor component according to claim 11, wherein the curable plastic resin comprises an epoxy resin.

* * * * *